United States Patent
Myung et al.

(10) Patent No.: US 11,523,524 B2
(45) Date of Patent: Dec. 6, 2022

(54) BENDABLE DISPLAY DEVICE HAVING IMPROVED FLATNESS AND DAMAGE PREVENTION

(71) Applicant: LG DISPLAY CO., LTD., Seoul (KR)

(72) Inventors: Nohjin Myung, Seoul (KR); Sanghak Shin, Gyeonggi-do (KR); Taehyoung Kwak, Gyeonggi-do (KR); Wansoo Lee, Gyeonggi-do (KR); Seungkyu Lee, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/959,070

(22) PCT Filed: Oct. 8, 2018

(86) PCT No.: PCT/KR2018/011829
§ 371 (c)(1),
(2) Date: Jun. 29, 2020

(87) PCT Pub. No.: WO2019/132194
PCT Pub. Date: Jul. 4, 2019

(65) Prior Publication Data
US 2020/0344899 A1    Oct. 29, 2020

(30) Foreign Application Priority Data
Dec. 29, 2017    (KR) .................. 10-2017-0183690

(51) Int. Cl.
*H05K 5/00* (2006.01)
*H01L 51/00* (2006.01)
(Continued)

(52) U.S. Cl.
CPC ....... *H05K 5/0017* (2013.01); *H01L 51/0097* (2013.01); *H01L 51/52* (2013.01); *H05K 5/0217* (2013.01); *H01L 27/3244* (2013.01)

(58) Field of Classification Search
None
See application file for complete search history.

(56) References Cited

U.S. PATENT DOCUMENTS

2008/0055831 A1    3/2008  Satoh
2014/0367644 A1    12/2014 Song et al.
(Continued)

FOREIGN PATENT DOCUMENTS

KR    10-2017-0021431 A    2/2017
KR    10-2017-0073304 A    6/2017

OTHER PUBLICATIONS

Kim, Y., et al. "Measurementof Hardness and Friction Properties of Pencil Leads for Quantification of Pencil Hardness Test." Advances in Applied Ceramics, vol. 115, No. 8, 2016, pp. 443-448., doi:10.1080/17436753.2016.1186364 (Year: 2016).*
(Continued)

*Primary Examiner* — Joe E. Schoenholtz
(74) *Attorney, Agent, or Firm* — Birch, Stewart, Kolasch & Birch, LLP

(57) ABSTRACT

A display device includes a display panel, a back plate disposed below the display panel, and a deformation prevention structure disposed below the back plate. The display panel, the back plate, and the deformation prevention structure are bendable in at least one bendable area. The deformation prevention structure has higher modulus than either the display panel or the back plate in the at least one bendable area. The display device is not deformed even after being repeatedly bent.

18 Claims, 9 Drawing Sheets

(51) Int. Cl.
  *H05K 5/02* (2006.01)
  *H01L 51/52* (2006.01)
  *H01L 27/32* (2006.01)

(56) References Cited

U.S. PATENT DOCUMENTS

| | | | |
|---|---|---|---|
| 2015/0147532 A1* | 5/2015 | Nam | B32B 7/022 428/172 |
| 2015/0255522 A1 | 9/2015 | Sato et al. | |
| 2016/0275830 A1* | 9/2016 | You | G02F 1/133305 |
| 2016/0323993 A1 | 11/2016 | Kwon et al. | |
| 2016/0357052 A1 | 12/2016 | Kim et al. | |
| 2017/0025634 A1 | 1/2017 | Jeong | |
| 2017/0153668 A1 | 6/2017 | Jang et al. | |
| 2017/0170417 A1 | 6/2017 | Myung et al. | |
| 2017/0373121 A1 | 12/2017 | Leng et al. | |
| 2018/0102496 A1* | 4/2018 | Kim | H05K 5/0017 |
| 2019/0127529 A1* | 5/2019 | Liu | H01L 51/0035 |
| 2019/0143638 A1* | 5/2019 | Park | B32B 25/042 361/820 |
| 2019/0189035 A1* | 6/2019 | Ochi | H01L 51/0097 |
| 2019/0229297 A1* | 7/2019 | Hu | B32B 38/1841 |
| 2019/0386247 A1* | 12/2019 | Choi | B32B 27/308 |
| 2020/0001577 A1* | 1/2020 | Woody, V | B32B 17/1077 |

OTHER PUBLICATIONS

"An Introduction to Copper" downloaded from URL<https://www.azom.com/properties.aspx?ArticleID=597> on Dec. 12, 2021. (Year: 2021).*

Texter, John & Tambe, N. & Crombez, R. & Antonietti, M. & Giordano, Cristina. (2010). Stimuli responsive coatings of carbon nanotubes and nanoparticles using ionic liquid-based nanolatexes. Polymeric Materials Science & Engineering. 102. 401-402. (Year: 2010).*

"Overview of Materials for Polyimide" downloaded from URL<http://www.matweb.com/errorUser.aspx?msgid=2&ckck=nocheck> on Dec. 12, 2021. (Year: 2021).*

Designerdata PUR downloaded from URL<https://designerdata.nl/materials/plastics/rubbers/polyurethane-rubber> on Dec. 12, 2021. (Year: 2021).*

International Search Report issued in International Application No. PCT/KR2018/011829 dated Mar. 19, 2019.

* cited by examiner

[Fig. 1]
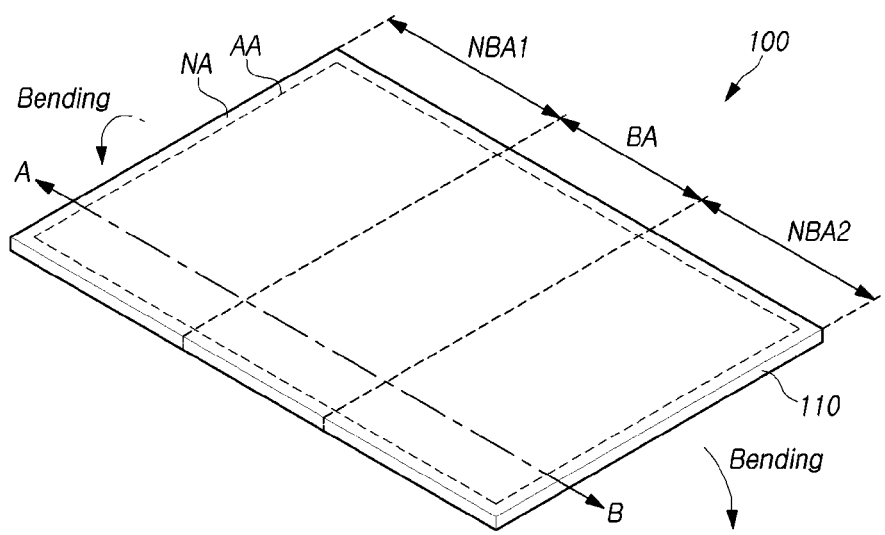
[Fig. 2]
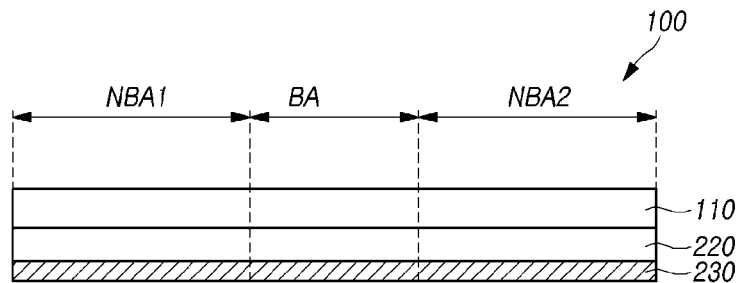
[Fig. 3]
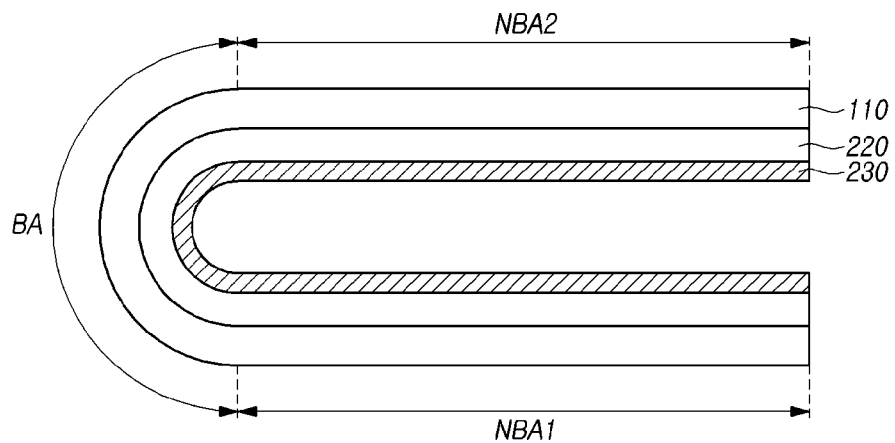

[Fig. 4]
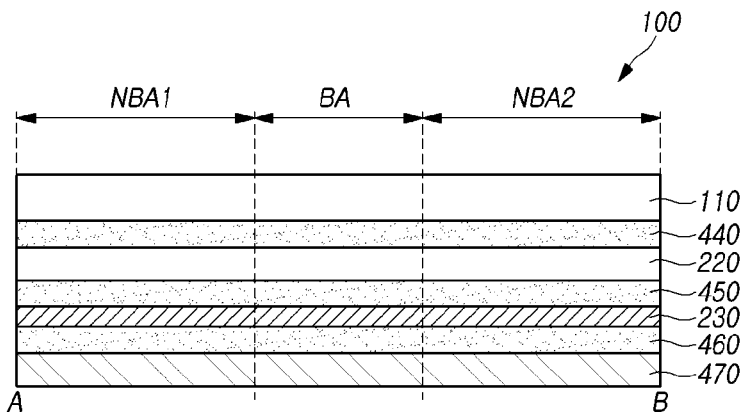
[Fig. 5]
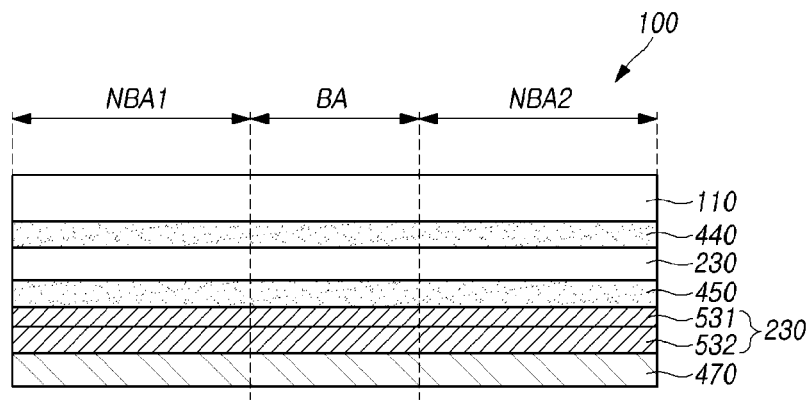
[Fig. 6]
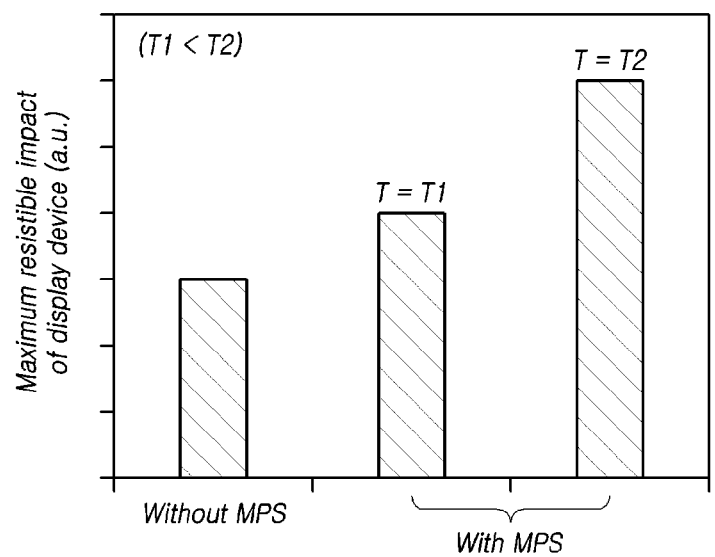

[Fig. 7]
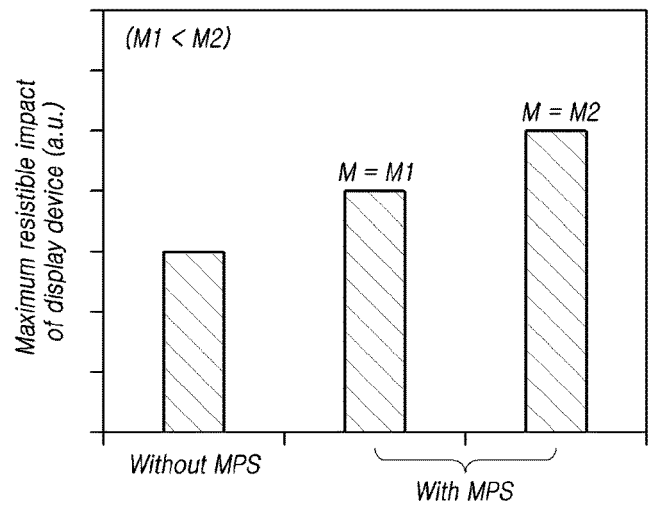
[Fig. 8]
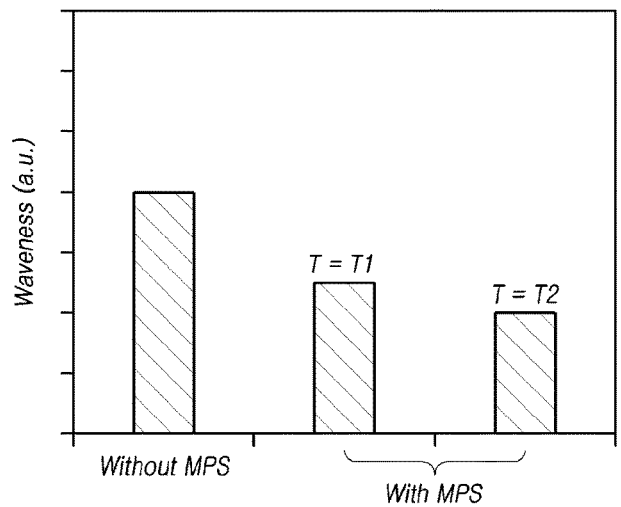
[Fig. 9]
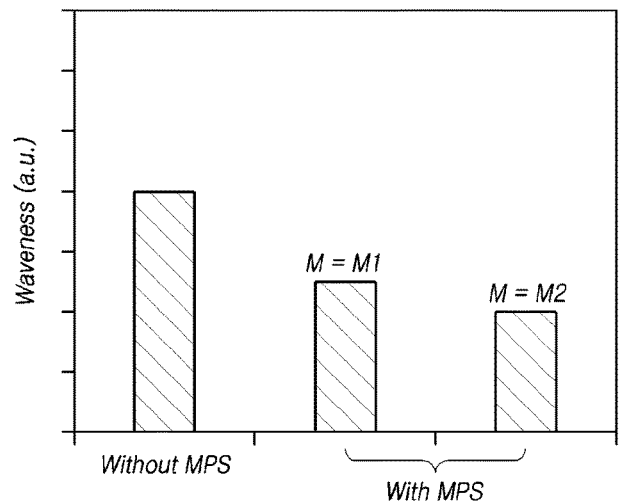

[Fig. 10]
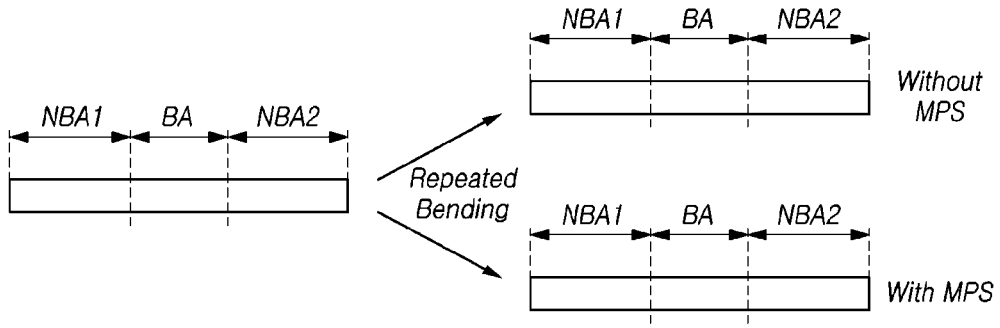
[Fig. 11]
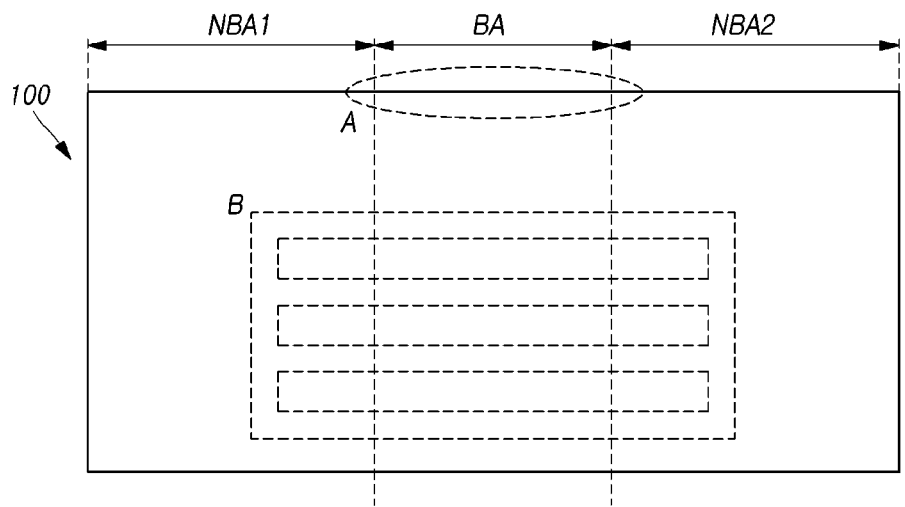
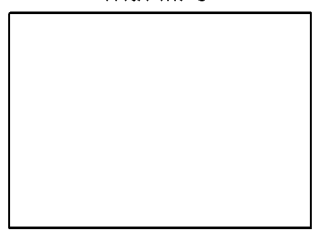
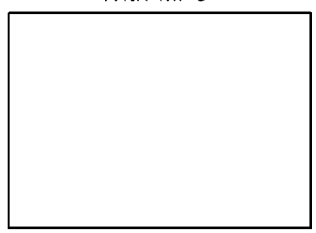

[Fig. 12]
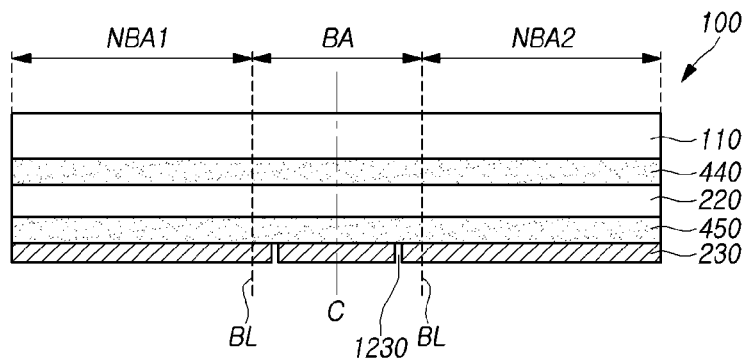
[Fig. 13]
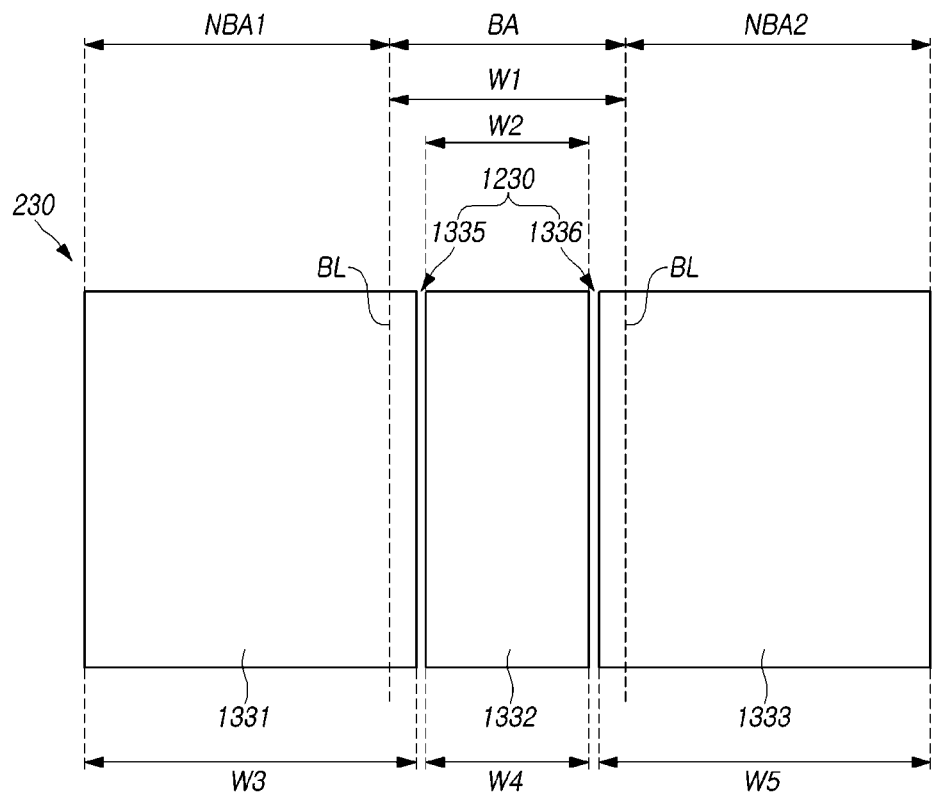

[Fig. 16]
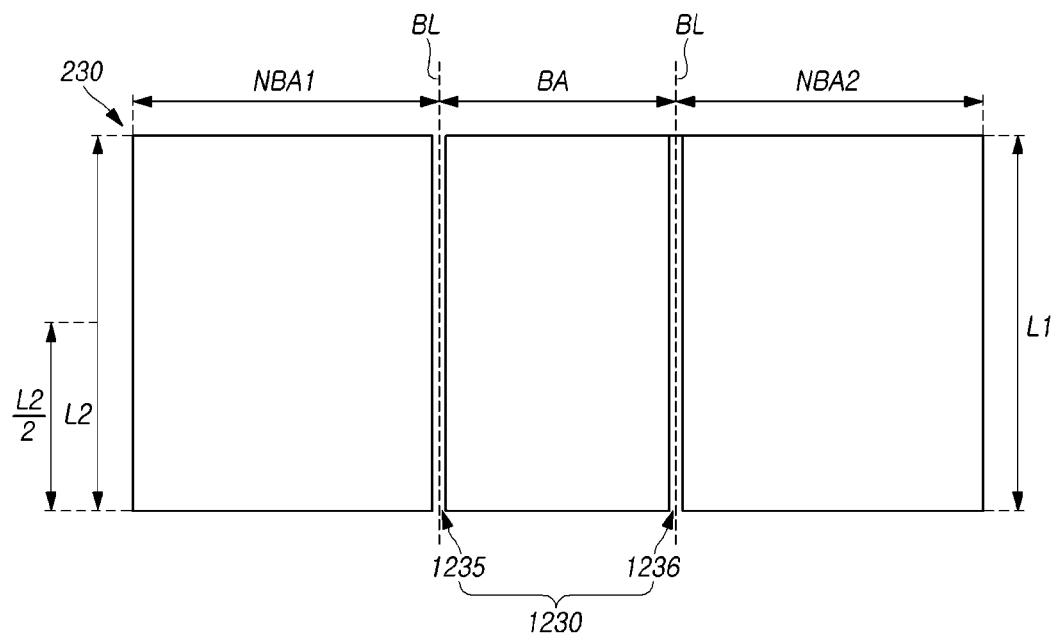

[Fig. 17]
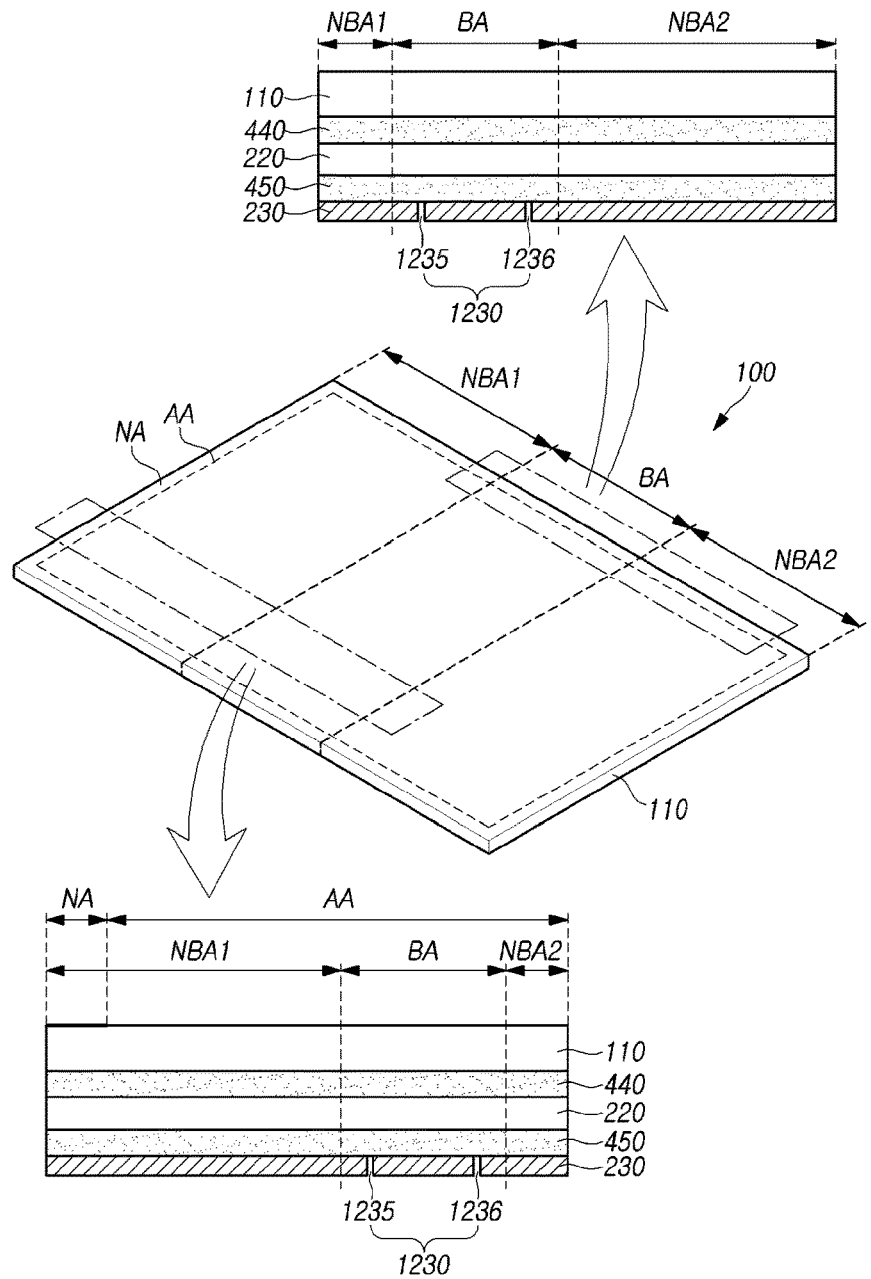
[Fig. 18]
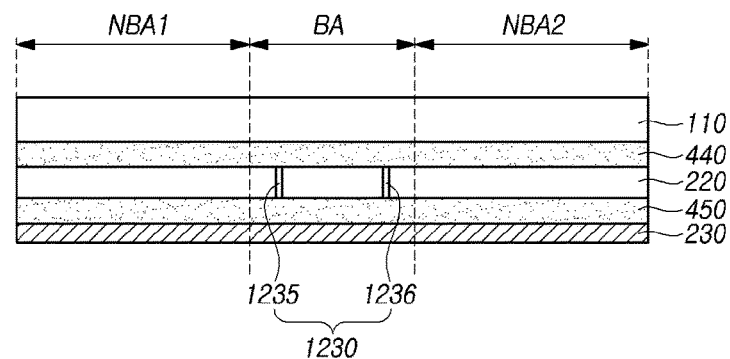

[Fig. 19]
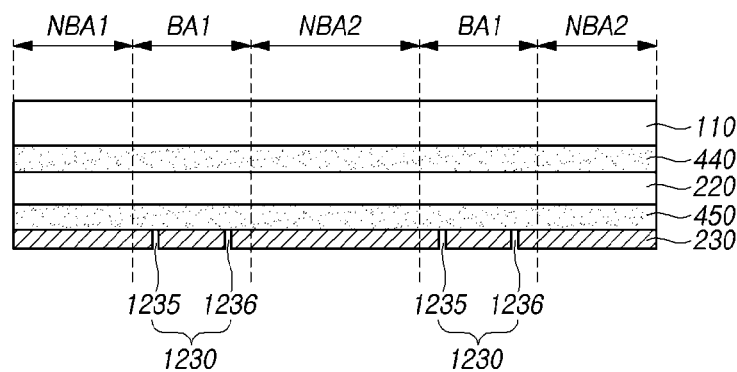

BENDABLE DISPLAY DEVICE HAVING IMPROVED FLATNESS AND DAMAGE PREVENTION

CROSS-REFERENCE TO RELATED APPLICATION

This application is a National Stage of International PCT/KR2018/011829 filed on Oct. 8, 2018, which claims priority to Korean Patent Application No. 10-2017-0183690, filed on Dec. 29, 2017, all of these applications are hereby incorporated by reference for all purposes as if fully set forth herein.

TECHNICAL FIELD

The present disclosure relates to a display device.

BACKGROUND ART

In response to gradual technological development, the demand for display devices has been increasing in a variety of forms. Recently, a range of display devices, such as liquid crystal display (LCD) devices, plasma display panel (PDP) devices, and organic light-emitting diode (OLED) display devices, have come into widespread use.

Such display devices are used not only in mobile devices, such as smartphones and tablet computers, but also in devices from within a range of other fields, such as televisions (TVs), vehicle displays, and wearable devices. Structural modifications are commonly required for such display devices to be used in a variety of fields.

Recently, bendable display devices, foldable display devices, curved display devices, rollable display devices, flexible display devices, and the like (hereinafter collectively referred to as "bendable display devices") are receiving more attention.

DISCLOSURE OF INVENTION

Technical Problem

Regarding the above-provided background, a bendable display device may have at least one bendable area, and may include constitutional components, such as a display panel and a back plate.

The bendable display device may be configured such that the display panel and the back plate thereof have small thicknesses to facilitate bending. Accordingly, when a concave-convex structure is provided in a component disposed below the display panel, the flatness of the display panel is reduced, such that an image distortion may appear, depending on the viewing angles.

In addition, the bendable display device may further include a backing member to prevent the thin display panel and the thin back plate from being deformed. The backing member may include at least one pattern in a bendable area to facilitate bending. However, the pattern of the backing member may lose the deformation prevention ability of the display panel and the back plate, which can cause the display device to be deformed when repeatedly bent.

In addition, the pattern of the backing member may also lose its impact resistance of the bendable area, which can cause fractures in the display device.

Furthermore, the backing member may be a factor in increasing the stiffness of the display device. Accordingly, when external force is applied to bend the display device at a preset curvature, the display device may be bent at a curvature lower than the preset curvature, which can be problematic.

Solution to Problem

Various aspects of the present disclosure provide a bendable display device having a structure able to improve the flatness of the display panel of the bendable display device.

Also provided is a bendable display device having a structure in which the display device may not be deformed even after being repeatedly bent.

Also provided is a bendable display device having a structure able to improve the impact resistance of the bendable display device.

Also provided is a bendable display device having a structure in which the display device may be bent at a degree of curvature corresponding to an amount of force applied to the display device to bend the display device.

According to exemplary embodiments, a display device may include: a display panel; a back plate disposed below the display panel; a deformation prevention structure disposed below the back plate; and at least one bendable area in which the display panel, the back plate, and the deformation prevention structure are bendable. The deformation prevention structure has higher modulus than either the display panel or the back plate in the at least one bendable area.

The deformation prevention structure may include a first deformation prevention structure and a second deformation prevention structure. A thickness of the first deformation prevention structure may be lower than a thickness of the second deformation prevention structure when the first deformation prevention structure is located more adjacently to the display panel than the second deformation prevention structure.

The deformation prevention structure may have two or more slits or two or more grooves in the bendable area. The two or more slits or grooves may be provided as lines disposed parallel to a boundary line between the bendable area and a non-bendable area extending from the bendable area.

A distance between outermost slits, from among the two or more slits may be shorter than a width of the bendable area.

Alternatively, a distance between outermost grooves, from among the two or more grooves, may be shorter than a width of the bendable area.

According to exemplary embodiments, a display device may include: a display panel; a back plate disposed below the display panel; an impact resistance-improving structure disposed below the back plate; and at least one bendable area in which the display panel, the back plate, and the impact resistance-improving structure are bendable. The impact resistance-improving structure has maximum impact resistance higher than either maximum impact resistance of the display panel or maximum impact resistance of the back plate.

Advantageous Effects of Invention

According to exemplary embodiments, the bendable display device has a structure able to improve the flatness of the display panel of the bendable display device.

According to exemplary embodiments, the bendable display device has a structure in which the display device may not be deformed even after being repeatedly bent.

According to exemplary embodiments, the bendable display device has a structure able to improve the impact resistance of the bendable display device.

According to exemplary embodiments, the bendable display device has a structure in which the display device may be bent at a degree of curvature corresponding to an amount of force applied to the display device to bend the display device.

BRIEF DESCRIPTION OF THE DRAWINGS

The above and other objects, features, and advantages of the present disclosure will be more clearly understood from the following detailed description when taken in conjunction with the accompanying drawings, in which:

FIG. 1 is a perspective view schematically illustrating a display device according to exemplary embodiments;

FIG. 2 is a cross-sectional view schematically illustrating the configuration of the display device according to the present exemplary embodiments;

FIG. 3 is a cross-sectional view schematically illustrating a bent shape of the display device according to the present exemplary embodiments;

FIG. 4 is a cross-sectional view taken along line A-B in FIG. 1;

FIG. 5 is a cross-sectional view illustrating the display device according to other exemplary embodiments;

FIG. 6 is a graph comparing the thickness-specific impact resistance of display devices according to exemplary embodiments with that of a display device without a deformation prevention structure;

FIG. 7 is a graph comparing the modulus-specific impact resistance of display devices according to exemplary embodiments with that of a display device without a deformation prevention structure;

FIG. 8 is a graph comparing the thickness-specific deformation resistance of display devices according to exemplary embodiments with that of a display device without a deformation prevention structure;

FIG. 9 is a graph comparing the modulus-specific deformation resistance of display devices according to exemplary embodiments with that of a display device without a deformation prevention structure;

FIG. 10 is a schematic view illustrating shapes of a display device without a deformation prevention structure and a display device having a deformation prevention structure after being bent;

FIG. 11 illustrates front reflected images of a display device without a deformation prevention structure and a display device having a deformation prevention structure;

FIG. 12 is a cross-sectional view illustrating a display device according to other exemplary embodiments;

FIG. 13 is a plan view illustrating the deformation prevention structure including two or more slits;

FIG. 16 is a plan view illustrating a deformation prevention structure including two or more slits according to other exemplary embodiments;

FIG. 17 is a cross-sectional view illustrating the positional relationship between the deformation prevention structure and a pad portion of the display panel in the display device according to exemplary embodiments;

FIG. 18 is a cross-sectional view illustrating a display device having a back plate according to other exemplary embodiments; and FIG. 19 is a cross-sectional view illustrating a display device including a plurality of bendable areas according to embodiments.

DETAILED DESCRIPTION OF THE EMBODIMENTS

Figure 14:
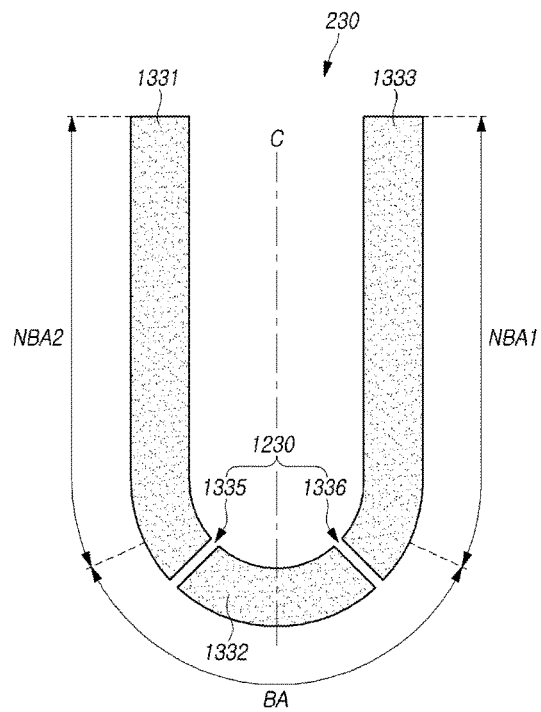
FIG. 14 is a cross-sectional view illustrating a bent shape of the deformation prevention structure including two or more slits.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from other elements. The substance, sequence, order, or number of such elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element.

In the same context, it will be understood that when an element is referred to as being located "on" or "under" another element, not only can it be directly formed on or under another element, but it can also be indirectly formed on or under another element via an intervening element.

Spatially relative terms such as "below," "beneath," "under," "lower," "above," and "upper" may be used herein for the ease of description of the relationship of an element or components to another element or other components as illustrated in the drawings. Such spatially relative terms should be construed as terms encompassing different orientations of the element in use or operation in addition to the orientation depicted in the drawings. For example, when elements illustrated in the drawings are inverted, an element described as "below," "beneath," or "under" another element would then be oriented "above" the other element. Thus, the example term "below," "beneath," or "under" can encompass both orientations of above and below.

In addition, terms such as "first," "second," "A," "B," "(a)," and "(b)" may be used herein to describe the components. It should be understood, however, that these terms are merely used to distinguish one component from other components and the substance, order, sequence, or number of the components is not limited by these terms.

FIG. 1 is a perspective view schematically illustrating a display device according to exemplary embodiments.

Referring to FIG. 1, a display device 100 according to exemplary embodiments includes at least one bendable area BA. The display device 100 can be reliably operated even in a situation in which the display device 100 is bent by external force.

In the following description, by way of example, the display device 100 according to the present exemplary embodiments will mainly be described as including a single bendable area BA, as well as a first non-bendable area NBA1 and a second non-bendable area NBA2 located on both sides of the bendable area BA.

Although the display device 100 is illustrated as being a bendable display device 100 having at least one bendable area BA in FIG. 1, this is merely an example. The display device 100 according to the present exemplary embodiments may be one of a variety of display devices 100, such as a foldable display device, a curved display device, a rollable display device, and a flexible display device.

In addition, the bending of the display device 100 according to exemplary embodiments may include a display device that is in a bent position or in a folded position, a display device that is bendable or spreadable, a display device that is foldable or unfoldable, and the like.

In addition, the term "bendable area" described herein may mean an area which may be altered from a non-bent state due to bending undertaken by a user or the like.

The bendable area may be provided as one or more bendable areas. When two or more bendable areas are provided, the bendable areas may have the same or different bent states (e.g., bent curvatures, bent surface states, or the like).

In addition, the positions of the bendable areas may be fixed in the display device or may be varied, depending on positions in which bending is undertaken by a user or the like.

Furthermore, the sizes of the bendable areas may be constantly the same or may be varied, depending on methods in which bending is undertaken by a user or the like.

The "non-bendable areas" may mean areas, other than the bendable areas, maintaining the states prior to bending.

The numbers, positions, sizes, and the like of the non-bendable areas may be determined by the above-described numbers, positions, sizes, and the like of the bendable areas.

Although the bendable areas may have a gradually-curved shape, the bendable areas may have an angled shape.

In addition, the display device 100 according to the present exemplary embodiments may be used in large-sized electronic devices, such as TVs and outdoor billboards, as well as small or medium-sized electronic devices, such as mobile phones, personal computers (PCs), notebook computers, personal digital assistants (PDAs), vehicle navigation units, game devices, portable electronic devices, watch-type electronic devices, and digital cameras.

Referring to FIG. 1, the display device 100 may be comprised of an active area AA and a non-active area NA.

The display device 100 displays images on the active area AA without displaying any images on the non-active area NA. A driver circuit and/or lines for driving the active area AA may be disposed in the non-active area NA. The non-active area NA is located on the outer circumference of the active area AA.

Although a structure in which the non-active area NA surrounds the active area AA is illustrated in FIG. 1, the present disclosure is not limited thereto. Any configurations in which the non-active area NA is located on a portion or the entirety of the outer circumference of the active area AA may be included.

Referring to FIG. 1, the active area AA of the display device 100 may be located in the bendable area BA and the first and second non-bendable areas NBA1 and NBA2. Thus, the display device 100 can display images on all of the bendable area BA and the first and second non-bendable areas NBA1 and NBA2.

The display device 100 includes a display panel 110 displaying images thereon. The display panel 110 may be one of a variety of panels, such as an organic light-emitting diode (OLED) panel and a liquid crystal display (LCD) panel. Hereinafter, the display device 100 will mainly be described as being used in an OLED panel for convenience of description.

Although not shown in the drawings, the OLED panel includes a plurality of data lines and a plurality of gate lines, such that a plurality of subpixels are defined thereon by the plurality of data lines and the plurality of gate lines.

In addition, each of the subpixels may include an OLED, i.e., a self-luminous device, as well as circuit devices, such as a driving transistor, for driving the OLED.

The types and numbers of the circuit devices of each subpixel may be determined variously, depending on functions to provide, designs, and the like.

Hereinafter, the configuration of the display device according to the present exemplary embodiments will be schematically described with reference to FIG. 2.

FIG. 2 is a cross-sectional view schematically illustrating the configuration of the display device according to the present exemplary embodiments.

Referring to FIG. 2, the display device 100 includes a display panel 110, a back plate 220 disposed below the display panel 110, and a deformation prevention structure 230 disposed below the back plate 220. The deformation prevention structure 230 is also referred to as a modification prevention structure (MPS; see FIGS. 6 to 11).

Here, the display panel 110 may include at least one bendable substrate, which may be a thin glass substrate or a polymer substrate. When the substrate of the display panel 110 is a polymer substrate, the substrate may be provided as a film containing one selected from the group consisting of a polyester-based polymer, a silicon-based polymer, an acrylic polymer, a polyolefin-based polymer, and copolymers thereof.

Specifically, the substrate may be made of one selected from among, but not limited thereto, polyethylene terephthalate (PET), polybutylene terephthalate (PBT), polysilane, polysiloxane, polysilazane, polycarbosilane, polyacrylate, polymethacrylate, poly(methyl acrylate)(PMA), poly(methyl metacrylate)(PMMA), poly(ethyl acrylate), poly(ethyl methacrylate), cyclic olefin copolymer (COC), cyclic olefin polymer (COP), polyethylene (PE), polypropylene (PP), polyimide (PI), polystyrene (PS), polyacetal (POM), polyether ether ketone (PEEK), polyester sulfone (PES), polytetrafluoroethylene (PTFE), polyvinyl chloride (PVC), polycarbonate (PC), polyvinylidene fluoride (PVDF), perfluoroalkyl polymer (PFA), styrene-acrylonitrile copolymer (SAN), and combinations thereof.

The back plate 220 may be disposed below the display panel 110 to protect or support the display panel 110.

In addition, the deformation prevention structure 230 can improve the resilience of the bendable display device 100 and increase the deformation resistance of the bendable display device 100.

The display device 100, including the display device 110 and the deformation prevention structure 230, may be bent as illustrated in FIG. 3.

FIG. 3 is a cross-sectional view schematically illustrating a bent shape of the display device according to the present exemplary embodiments.

Referring to FIG. 3, components of the display device 100 may be bent in the bendable area BA by external force. When external force is applied to the display device 100, the display panel 110, the back plate 220, and the deformation prevention structure 230 may be bent in the bendable area BA.

In this case, the display device 100 may be bent in the shape of the letter "U." However, the display device 100 illustrated in FIG. 3 is merely an example, and the bent shape of the display device 100 is not limited thereto.

When the display device 100 is in a bent position, the display device 100 may be shaped such that the first non-bendable area NBA1 and the second non-bendable area NBA2 face each other.

Although the first non-bendable area NBA1 and the second non-bendable area NBA2 are illustrated as having the same areas, the present disclosure is not limited thereto. The first non-bendable area NBA1 and the second non-bendable area NBA2 may have different areas.

The display device 100 is bendable in a variety of directions in the bendable area BA. For example, the display device 100 may be bent such that a display surface, on which images are displayed, is located outside or inside of the display device 100.

The structure of the bendable display device 100 may be specifically described as follows.

FIG. 4 is a cross-sectional view taken along line A-B in FIG. 1.

Referring to FIG. 4, the display device 100 includes the display panel 110, a first bonding layer 440, the back plate 220, a second bonding layer 450, the deformation prevention structure 230, a third bonding layer 460, and a middle frame (or a backing member) 470.

The first bonding layer 440 is disposed below the display panel 110, the back plate 220 is disposed below the first bonding layer 440, the second bonding layer 450 is disposed below the back plate 220, the deformation prevention structure 230 is disposed below the second bonding layer 450, the third bonding layer 460 is disposed below the deformation prevention structure 230, and the middle frame 470 is disposed below the third bonding layer 460.

The first bonding layer 440 may serve to couple the display panel 110 and the back plate 220, the second bonding layer 450 may serve to couple the back plate 220 and the deformation prevention structure 230, and the third bonding layer 460 may serve to couple the deformation prevention structure 230 and the middle frame 470.

In addition, the components of the bendable display device 100 may have small thicknesses to facilitate bending, and the middle frame 470 may serve to support the thin components. Here, the middle frame 470 supporting the display panel 110 and the back plate 220 may mean that the middle frame 470 supports the display panel 110 and the back plate 220 so that the display panel 110 and the back plate 220 return to their original shapes (i.e., are not plastically deformed) when the display panel 110 and the back plate 220 are bent or are unbent from bent positions.

The middle frame 470 may have one or more grooves 480 in the bendable area BA of the display device 100. When the display device 100 is to be bent, the one or more grooves 480 provided in the middle frame 470 serve to facilitate the bending of the middle frame 470 and the other components disposed on the middle frame 470, including the display panel 100, the first to third bonding layers 440, 450, and 460, the back plate 220, and the deformation prevention structure 230.

Although the one or more grooves 480, provided in the middle frame 470, may serve to facilitate the bending of the display device 100, the supporting force of the middle frame 470 is reduced in the bendable area BA in which the grooves 480 are provided. Consequently, when the display device 100 is bent or unbent from the bent position, the display device 100 may be deformed in the bendable area BA without returning to its original shape.

In addition, since the middle frame 470 has the one or more grooves 480 in the bendable area BA, the area able to absorb impacts is reduced. This may consequently reduce the impact resistance of the area having the one or more grooves 480 to be lower than the impact resistance of the area without the one or more grooves 480, thereby reducing the impact resistance of the display device 100 in the bendable area BA.

In addition, since the thicknesses of the components disposed on the middle frame 470 are reduced, the one or more grooves 480 provided in the middle frame 470 reduce the flatness of the display panel 110, so that an image may appear different, depending on viewing angles.

The display device 100 according to the present exemplary embodiments has a structure that can improve the impact resistance of the display device 100 even in the case in which the middle frame 470 has the one or more grooves 480 in the bendable area BA while allowing the display device 100 to maintain the original shape when the display device 100 is unbent after being bent.

In addition, the display device 100 has a structure that can prevent the flatness of the display panel 100 from being reduced by the grooves 480 of the middle frame 470.

Specifically, in the display device 100 according to exemplary embodiment, the deformation prevention structure 230 is disposed between the display panel 110 and the middle frame 470. The deformation prevention structure 230 may be disposed between the back plate 220 protecting the display panel 110 and the middle frame 470.

The modulus of the deformation prevention structure 230 may be higher than either the modulus of the display panel 110 or the modulus of the back plate 220. Here, the modulus is an elastic modulus expressing a ratio of stress to strain.

The modulus of the deformation prevention structure 230 being higher than either the modulus of the display panel 110 or the modulus of the back plate 220 indicates that the strain of the deformation prevention structure 230 is lower than either the strain of the display panel 110 or the strain of the back plate 220 when the deformation prevention structure 230, the display panel 110, and the back plate 220 are subjected to the same levels of stress.

Thus, the restoring force of the deformation prevention structure 230 to return to the original shape may be higher than either the restoring force of the display panel 110 or the restoring force of the back plate 220.

Consequently, when the display device 100 is bent or unbent from the bent position, the deformation prevention structure 230 can support the display panel 110 and the back plate 200 to return to the original shapes.

The thickness of the deformation prevention structure 230 may range from 30 μm to 70 μm. When the thickness of the deformation prevention structure 230 is lower than 30 μm, the supporting force of the deformation prevention structure 230 supporting the display panel 110 and the back plate 220 may be reduced. In contrast, when the thickness of the deformation prevention structure 230 is greater than 70 μm, the amount of external force necessary for bending the display device 100 is increased, so that the display panel 110, the back plate 220, and the like may be damaged when the display device 100 is bent.

In addition, the deformation prevention structure 230 has high impact resistance due to the high modulus thereof, and the impact resistance of the display device 100 can also be increased, due to the high impact resistance of the deformation prevention structure 230 provided in the display device 100.

The impact resistance of the display device 100 including the deformation prevention structure 230 will be discussed in terms of impact force (F) applied to the display device 100.

The impact force (F) applied to the display device 100 may be a product of the mass (m) and acceleration (a) of an object that applies impact force to the display device 100.

Since the modulus of the deformation prevention structure 230 is higher than either the modulus of the display panel 110 or the modulus of the back plate 220, the display device 100 without the deformation prevention structure 230 can have higher impact-absorbing ability than the display device 100 having the deformation prevention structure 230. Then, the display device 100 having the deformation prevention structure 230 may collide with an object for an extended period of time, and the impact force (F) is reduced with an increase in time for which the deformation prevention structure 230 collides with the object.

Accordingly, when an impact is applied to the display device 100 including the deformation prevention structure 230, this configuration can reduce the impact force (F), thereby improving the impact resistance of the display device 100.

In summary, since the impact resistance of the deformation prevention structure 230 is high, the impact resistance of the display device 100, including the deformation prevention structure 230, may also be increased. Thus, even if a high impact is applied, the display device 100 including the deformation prevention structure 230 can resist the impact applied thereto, so that damage to the display device 100 can be reduced or prevented.

In addition, the deformation prevention structure 230 is disposed between the display panel 110 and the middle frame 470 to provide a space between the display panel 110 and the middle frame 470. This can consequently prevent the flatness of the display panel 110 from be reduced by the grooves 480 of the middle frame 470 provided in the bendable area BA.

Hereinafter, a display device 100 according to other exemplary embodiments will be described with reference to FIG. 5.

FIG. 5 is a cross-sectional view illustrating the display device according to other exemplary embodiments. In the following description, descriptions of some features (e.g., components, effects, or the like), which are the same as those of the foregoing embodiments, may be omitted.

Referring to FIG. 5, the display device 100 includes a display panel 110, a first bonding layer 440, a back plate 220, a second bonding layer 450, a deformation prevention structure 230, and a middle frame 470.

The deformation prevention structure 230 includes a first deformation prevention structure 531 and a second deformation prevention structure 532.

The first deformation prevention structure 531 may be located closer to the display panel 110 than the second deformation prevention structure 532. In addition, the thickness of the first deformation prevention structure 531 may be lower than the thickness of the second deformation prevention structure 532.

Since the thickness of the first deformation prevention structure 531 is lower than the thickness of the second deformation prevention structure 532, the deformation prevention structure 230 can reliably support the display panel 110 and the back plate 220 when the display device 100 is bent.

The first deformation prevention structure 531 and the second deformation prevention structure 532 may have different modulus. Specifically, the modulus of the first deformation prevention structure 531 and the second deformation prevention structure 532 may differ from each other in the range of 100 GPa to 200 GPa.

Due to the different modulus of the first deformation prevention structure 531 and the second deformation prevention structure 532, it is possible to adjust the modulus of the deformation prevention structure 530 to a modulus value at which the display panel 110 and the back plate 220 can be efficiently supported.

Hereinafter, the impact resistance, resilience, and the deformation resistance of display devices according to some exemplary embodiments will be compared with those of a display device without a deformation prevention structure with reference to FIGS. 6 to 9.

FIG. 6 is a graph comparing the thickness-specific impact resistance of display devices according to some exemplary embodiments with that of a display device without a deformation prevention structure. FIG. 7 is a graph comparing the modulus-specific impact resistance of display devices according to some exemplary embodiments with that of a display device without a deformation prevention structure. FIG. 8 is a graph comparing the thickness-specific deformation resistance of display devices according to some exemplary embodiments with that of a display device without a deformation prevention structure. FIG. 9 is a graph comparing the modulus-specific deformation resistance of display devices according to some exemplary embodiments with that of a display device without a deformation prevention structure.

Here, each of the display devices without a deformation prevention structure, illustrated in FIGS. 6 to 9, includes a display panel, a first bonding layer, a back plate, a second bonding layer, and a middle frame.

In addition, each of the display devices according to exemplary embodiments, illustrated in FIGS. 6 to 9, includes a display panel, a first bonding layer, a back plate, a second bonding layer, a deformation prevention structure, a third bonding layer, and a middle frame.

The display devices according to exemplary embodiments, illustrated in FIGS. 6 and 8, include the deformation prevention structures having different thicknesses. Specifically, the deformation prevention structure having a first thickness T1 is thinner than the deformation prevention structure having a second thickness T2.

The display devices according to exemplary embodiments, illustrated in FIGS. 7 and 9, include the deformation prevention structures having different modulus. Specifically, the deformation prevention structure having a first modulus M1 is less elastic than the deformation prevention structure having a second modulus M2.

To measure the impact resistance of the display devices according to some exemplary embodiments and comparative embodiments, illustrated in FIGS. 6 and 7, tests were performed by dropping a 22g steel ball onto the display devices after passing through a pipe.

In FIGS. 6 and 7, the X axis indicates the display device without a deformation prevention structure and the display devices respectively including a deformation prevention structure, while the Y axis indicates a maximum resistible impact of the display devices when a steel ball is dropped thereon.

As can be appreciated from FIG. 6, a maximum resistible impact that the display devices having a deformation prevention structure can resist, without being damaged by the steel ball, is higher than a maximum resistible impact that the display device without a deformation prevention structure can resist.

In addition, it is appreciated that, in the display devices having a deformation prevention structure, the display device, the deformation prevention structure of which has a higher thickness (T=T2), can resist higher impact force than the display device, the deformation prevention structure of which has a lower thickness (T=T1).

That is, the thicker the deformation prevention structure is, the higher the impact resistance of the display device can be.

In addition, as can be appreciated from FIG. 7, a maximum resistible impact that the display devices having a deformation prevention structure, according to exemplary embodiments, can resist, without being damaged by the steel ball, is higher than a maximum resistible impact that the display device without a deformation prevention structure can resist. In addition, in the display devices having a deformation prevention structure, the display device, the deformation prevention structure of which has a higher modulus M2, can resist higher impacts than the display device, the deformation prevention structure of which has a lower modulus M1.

That is, the higher the modulus of the deformation prevention structure is, the higher the impact resistance of the display device can be.

As can be appreciated from FIG. 8, the display device without a deformation prevention structure is more deformed, more particularly, is more wavy or waved, after being bent further than the display devices according to exemplary embodiments.

In addition, in the display devices having a deformation prevention structure, the display device, the deformation prevention structure of which has a higher thickness (T=T2), is less waved than the display device, the deformation prevention structure of which has a lower thickness (T=T1).

That is, the greater the thickness of the deformation prevention structure is, the display device can be less deformed after being bent.

In addition, as can be appreciated from FIG. 9, the display devices according to some exemplary embodiments is less deformed after being bent further than the display device without a deformation prevention structure. In addition, in the display devices having a deformation prevention structure, the display device, the deformation prevention structure of which has a higher modulus M2, is less deformed, more particularly, is less waved, after being bent further than the display device, the deformation prevention structure of which has a lower modulus M1.

In addition, the higher the modulus of the deformation prevention structure is, the higher the ability of the display device to prevent deformation, more particularly, waviness, after being bent can be.

FIG. 10 is a schematic view illustrating shapes of a display device without a deformation prevention structure and a display device having a deformation prevention structure after being bent.

As can be appreciated from FIG. 10, the display device without a deformation prevention structure becomes deformed, more particularly, has waviness after being bent. In contrast, the display device having a deformation prevention structure, according to exemplary embodiments, is subjected to substantially no deformation, more particularly, no waviness after being bent.

FIG. 11 illustrates front reflected images of a display device without a deformation prevention structure and a display device having a deformation prevention structure.

The reflected images of the display device 100 without a deformation prevention structure and the display device 100 having a deformation prevention structure include front reflected images of an outer portion A of each display device 100 including the bendable area BA and an inner portion B of each display device 100 including the bendable area BA.

Referring to FIG. 11, the outer portion A and the inner portion B of the display device 100 without a deformation prevention structure have uneven front images. The uneven front images are formed due to the one or more grooves of the middle frame, located in the bendable area BA, lower the flatness of the display panel and the back plate.

In contrast, it can be appreciated that the outer portion A and the inner portion B of the display device 100 having a deformation prevention structure have even front images. The even front images are formed, since the deformation prevention structure prevents the flatness of the display panel and the back plate from being affected by the one or more grooves of the middle frame.

As described above, the display device 100 according to exemplary embodiments includes at least one layer of the deformation prevention structure 230, having high impact resistance, between the display panel 100 and the middle frame 470. This can consequently improve the impact resistance and deformation resistance of the display device 100 while preventing the flatness of the display panel 100 from being affected by the grooves 480 of the middle frame 470, so that image quality is not lowered.

The display device 100 may include the deformation prevention structure 230 having two or more slits or two or more grooves.

FIG. 12 is a cross-sectional view illustrating a display device according to other exemplary embodiments. In the following description, descriptions of some features (e.g., components, effects, or the like), which are the same as those of the foregoing embodiments, may be omitted.

Referring to FIG. 12, the display device 100 includes a display panel 110, a first bonding layer 440, a back plate 220, a second bonding layer 450, and a deformation prevention structure 230.

When the display device 100 is bent, the display device 100 may be bent at a curvature defined by an external force smaller than the external force actually applied thereto. This is because the actual curvature is reduced to be smaller than a preset curvature, due to an increase in the stiffness of components of the display device.

Specifically, the components of the display device 100 are configured to have low thicknesses to facilitate the bending of the display device 100. Due to the low thicknesses of the components, a stiff backing member is required to support the components of the display device 100. Thus, the use of the stiff backing member increases the stiffness of the display device 100. Accordingly, even if external force is applied to bend the display device 100 at a preset curvature, the display device 100 may be bent at a curvature smaller than the preset curvature.

Since the display device 100 according to the present exemplary embodiments includes the deformation prevention structure 230, the thickness of the display device 100 may be increased by the thickness of the deformation prevention structure 230.

Accordingly, a greater amount of external force may be required to bend the display device 100 including the deformation prevention structure 230 than to bend the display device without a deformation prevention structure. In particular, when higher external force is applied to bend the display device 100, the display device 100 may be deformed (or waved) or damaged, and the difference between a preset curvature and an actual curvature of the display device 100 in the case of bending may be further increased.

The display device 100 according to the present exemplary embodiments provides a structure able to reduce the difference between a preset curvature and an actual curvature when the display device 100 is bent, so that the display device 100 can be bent at the preset curvature without being applied with an excessive amount of external force.

In this regard, the deformation prevention structure 230 of the display device 100 includes two or more slits 1230 in the bendable area BA.

Specifically, as illustrated in FIG. 12, the deformation prevention structure 230 may have two gaps in the banding area BA, due to the two or more slits 1230.

The slits 1230 may be provided as lines parallel to the boundary lines BL located between the bendable area BA and the first and second non-bendable areas NBA1 and NBA2 extending from the bendable area BA.

The two or more slits 1230 of the deformation prevention structure 230 may be spaced apart at predetermined distances from the center line C located in the bendable area BA. The center line C is a line extending through the center of the bendable area BA to be parallel to the boundary lines BL between the bendable area BA and the first and second non-bendable areas NBA1 and NBA2, located outside of the bendable area BA.

In addition, the two slits 1230 may be located closer to the boundary line between the bendable area BA and the first non-bendable area NBA1 and the boundary line between the bendable area BA and the second non-bendable area NBA2 than the center line C of the bendable area BA.

Since the display device 100 includes the deformation prevention structure 230 having the slits 1230, the display device 100 can be easily bent in the bendable area BA.

Specifically, in the area in which the slits 1230 are provided, the thickness of the display device 100 may be the same as a total of the thicknesses of the display panel 100, the first bonding layer 440, the back plate 220, and the second bonding layer 450. The smaller the thickness of the display device 100 is, the smaller the amount of external force for bending the display device 100 is. A portion of the deformation prevention structure 230 is removed in the area in which the slits 1230 of the deformation prevention structure 230 are located. Accordingly, the display device 100 may be easily bent.

Hereinafter, the deformation prevention structure 230 including the slits 1230 will be described in detail with reference to FIGS. 13 and 14.

FIG. 13 is a plan view illustrating the deformation prevention structure including two or more slits, and FIG. 14 is a cross-sectional view illustrating a bent shape of the deformation prevention structure including two or more slits.

First, referring to FIG. 13, the deformation prevention structure 230 includes two or more slits 1230, e.g., a first slit 1335 and a second slit 1336, located in the bendable area.

The slits 1230 may divide the deformation prevention structure 230 into three segments.

Specifically, the deformation prevention structure 230 may be divided into first to third deformation prevention structure segments 1331, 1332, and 1333 by the first slit 1335, located adjacently to the boundary line BL between the first non-bendable area NBA1 and the bendable area BA, and the second slit 1336, located adjacently to the boundary line BL between the bendable area BA and the second non-bendable area NBA2.

The first deformation prevention structure segment 1331 may be located in the first non-bendable area NBA1 and a portion of the bendable area BA, the second deformation prevention structure segment 1332 may be located in the bendable area BA, and the third deformation prevention structure segment 1333 may be located in a portion of the bendable area BA and the second non-bendable area NBA2.

The distance W2 between the two slits 1230 is the same as the width W4 of the second deformation prevention structure segment 1332.

In addition, each of the distance W2 between the two slits 1230 and the width W4 of the second deformation prevention structure segment 1332 may be smaller than either the width W3 of the first deformation prevention structure segment 1331 or the width W5 of the third deformation prevention structure segment 1333.

The relationship of the distance W2 between the two slits 1230 and the width W4 of the second deformation prevention structure segment 1332 to the width W3 of the first deformation prevention structure segment 1331 or the width W5 of the third deformation prevention structure segment 1333 may be varied, depending on the positions of the first and second non-bendable areas NBA1 and NBA2, the bendable area BA, and the slits 1230.

The distance W2 between the two slits 1230 may be the distance between one edge and the opposite edge of the second deformation prevention structure 1332, located adjacently to the slits 1230. The widths W3, W4, and W5 of the first to third deformation prevention structure segments 1231, 1232, and 1233, as well as the distance between one edge and the opposite edge of the second deformation prevention structure 1332, located adjacently to the slits 1230, mean distances in a direction perpendicular to the boundary lines BL between the first and second non-bendable areas NBA1 and NBA2 and the bendable area BA.

Since the two slits 1230 are located in the bendable area BA, the distance between the two slits 1230 may be smaller than the width W1 of the bendable area BA.

As illustrated in FIG. 13, the deformation prevention structure 230 includes two or more slits 1230 provided in the bendable area BA. This configuration can improve bending stiffness applied to the bendable area BA. Bending stiffness means an amount of force required for the display device 100 to have a preset curvature when the display device 100 is bent by applying external force thereto.

Here, low bending stiffness means that the display device 100 is not bent by an amount equal to force applied to bend the display device 100, i.e., the display device 100 is bent at a curvature smaller than a curvature corresponding to an amount of force applied thereto. In other words, the lower the bending stiffness is, the greater the difference between the preset curvature and the actual curvature of the display device 100 is.

Bending stiffness is a value obtained by dividing a bending moment M with a product of the width and curvature R of the display device 100. The width of the display device is a length in a direction perpendicular to the boundary lines BL between the first and second non-bendable areas NBA1 and NBA2 and the bendable area BA.

Herein, the two or more slits 1230 provided in the deformation prevention structure 230 may reduce the width of the display device 100. Specifically, when the two slits 1230 are provided in the bendable area BA, the width of the display device 100 may be applied using the distance W2 between the first slit 1335 and the second slit 1336.

More specifically, the two slits 1230 are provided in the bendable area BA in which the display device 100 is actually bent, the deformation prevention structure 230 is divided in the bendable area BA by the two slits 1230, and the entirety of the second deformation prevention structure segment 1332, among the divided deformation prevention structure 230, participates in the bending. Accordingly, the width of the display device 100 may be regarded as the distance W2 between the first slit 1335 and the second slit 1336.

According to exemplary embodiments, the distance W2 between the first slit 1335 and the second slit 1336 may be used for the width of the display device 100 to obtain a value of bending stiffness of the display device 100. Accordingly, the width for the bending stiffness is reduced to be smaller than the actual width of the display device 100.

Since the width and the bending stiffness of the display device 100 are inversely proportional to each other, when the width of the display device 100 is reduced to be the distance W2 between the first slit 1335 and the second slit 1336, the bending stiffness is increased. Consequently, the difference between the preset curvature and the actual curvature of the display device 100 may be reduced. The slits 1230 of the deformation prevention structure 230 may serve to adjust the actual curvature of the display device 100 to reduce the difference between the preset curvature and the actual curvature of the display device 100.

In other words, when external force is applied to the display device 100 to bend the display device 100, the slits 1230 of the deformation prevention structure 230 allow the display device 100 to be bent at a curvature corresponding to the external force applied to the display device 100.

FIG. 14 illustrates a bent shape of the deformation prevention structure including the slits.

Referring to FIG. 14, the deformation prevention structure 230, including the two slits 1230, may be curved in the bendable area BA. For example, the deformation prevention structure 230 may be bent in the shape of the letter "U."

Although not shown in the drawings, the deformation prevention structure 230 is bent in regions outside of the two slits 1230, instead of being bent in regions corresponding to the two slits 1230, since an area to be bent is determined based on at least one component of the components disposed above or below the deformation prevention structure 230.

When the deformation prevention structure 230 is in a bent position, the first and second slits 1230 may be disposed symmetrically about the center line C, but the present disclosure is not limited thereto.

Although the slits 1230 are illustrated as being parallel to the boundary lines BL between the first and second non-bendable areas NBA1 and NBA2 and the bendable area BA in FIGS. 13 and 14, the present disclosure is not limited thereto. For example, the slits may have a variety of shapes, such as a zigzag shape.

Figure 15:
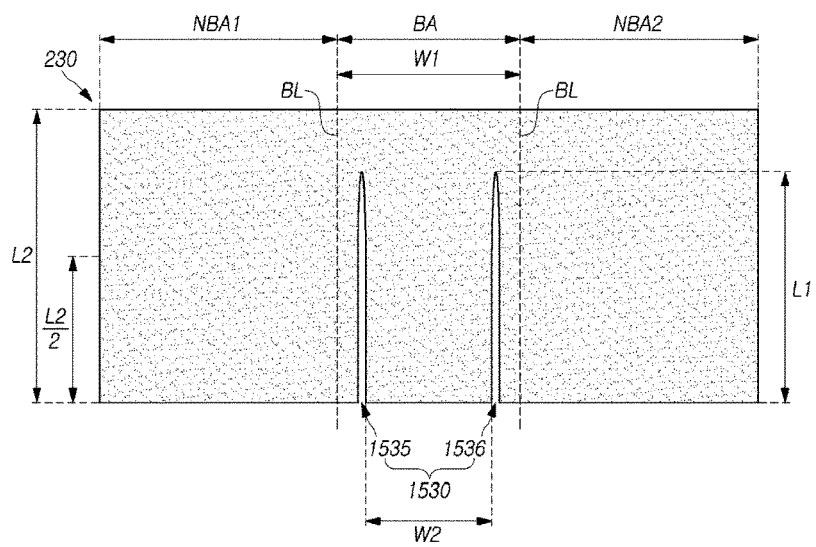
FIG. 15 is a plan view illustrating a deformation prevention structure including two or more grooves according to other exemplary embodiments.

In addition, as illustrated in FIG. 15, the slits 1230 may be provided in the shape of grooves, instead of in the shape of slits. This shape will be described hereinafter with reference to FIG. 15.

FIG. 15 is a plan view illustrating a deformation prevention structure including two or more grooves according to other exemplary embodiments. In the following description, descriptions of some features (e.g., components, effects, or the like), which are the same as those of the foregoing embodiments, may be omitted.

Referring to FIG. 15, the deformation prevention structure 230 includes two or more grooves 1530. The grooves 1530 may be provided as lines parallel to the boundary lines BL located between the bendable area BA and the first and second non-bendable areas NBA1 and NBA2 provided outside of the bendable area BA.

The distance W2 between the outermost grooves among the two or more grooves 1530 may be shorter than the width W1 of the bendable area BA. In FIG. 15, the grooves 1530 are illustrated as being two grooves, in which the outermost grooves indicate a first groove 1535 and a second groove 1536, respectively.

The length L1 of the grooves 1530 may be shorter than the length L2 of the deformation prevention structure 230 and longer than the half L2/2 of the length L2 of the deformation prevention structure 230.

The length L1 of the grooves 1530 and the length L2 of the deformation prevention structure 230 may be lengths of portions parallel to the boundary lines BL between the first and second non-bendable areas NBA1 and NBA2 and the bendable area BA. That is, the length L1 and the length L2 may be lengths based on the boundary lines BL between the first and second non-bendable areas NBA1 and NBA2 and the bendable area BA.

According to the present exemplary embodiments, the length L1 of the grooves 1530 may be determined to be longer than the half L2/2 of the length L2 of the deformation prevention structure 230 to increase the bending stiffness of the display device 100 in which the deformation prevention structure 230 having the grooves 1530 is provided.

Specifically, when the length L1 of the grooves 1530 is longer than a half L2/2 of the length L2 of the deformation prevention structure 230, the distance W2 between the first groove 1535 and the second groove 1536 can be used in the display device 100, in place of the width of the bendable area, thereby improving the bending stiffness of the display device 100.

Accordingly, when force is applied to the display device 100 to bend the display device 100, the display device 100 may be bent at a curvature corresponding to the force applied to the display device 100.

Although the configuration in which two or more slits 1230 or two or more grooves 1530 are located closer to the boundary lines BL between the first and second non-bendable areas NBA1 and NBA2 and the bendable area BA than the center line C of the bendable area BA has mainly been described with reference to FIGS. 12 to 15, the present disclosure is not limited thereto.

FIG. 16 is a plan view illustrating a deformation prevention structure including two or more slits according to other exemplary embodiments. In the following description, descriptions of some features (e.g., components, effects, or the like), which are the same as those of the foregoing embodiments, may be omitted.

As illustrated in FIG. 16, the two or more slits 1230 of the deformation prevention structure 230 according to the present exemplary embodiments may be located to overlap the boundary lines BL between the first and second non-bendable areas NBA1 and NBA2 and the bendable area BA.

A start region and an end region, in which the deformation prevention structure 230 is bent, may correspond to regions in which the first and second slits 1235 and 1236 are located.

FIG. 17 is a cross-sectional view illustrating the positional relationship between the deformation prevention structure and a pad portion of the display panel in the display device according to exemplary embodiments. In the following description, descriptions of some features (e.g., components, effects, or the like), which are the same as those of the foregoing embodiments, may be omitted.

Referring to FIG. 17, the display device 100 includes the active area AA and the non-active area NA located on the outer circumference of the active area AA. The two or more slits 1230, provided in the deformation prevention structure 230, may extend from the active area AA to the non-active area NA.

Due to this configuration, in a region corresponding to the non-active area NA located on the outer circumference of the active area AA, the display device 100 may be bent at a curvature corresponding to force applied thereto evenly.

In addition, the display panel 110 may include a pad portion 1710 located in the non-active area NA, and a portion of the deformation prevention structure 230 may overlap the pad portion 1710.

Due to this configuration, the impact resistance and deformation resistance of the display device 100 in the region corresponding to the pad portion 1710 can be improved.

Although the configuration in which the deformation prevention structure 230 is provided with two or more slits 1230 or two or more grooves 1530 in the bendable area BA has mainly been described with reference to FIGS. 12 to 17, the present disclosure is not limited thereto.

FIG. 18 is a cross-sectional view illustrating a display device having a back plate according to other exemplary embodiments. In the following description, descriptions of some features (e.g., components, effects, or the like), which are the same as those of the foregoing embodiments, may be omitted.

Referring to FIG. 18, the display device 100 includes the display panel 110, the first bonding layer 440, the back plate 220, the second bonding layer 450, and the deformation prevention structure 230.

The back plate 220 may be provided with the two or more slits 1230 in the bendable area BA.

The slits 1230 may be provided as lines parallel to the boundary lines BL located between the bendable area BA and the first and second non-bendable areas NBA1 and NBA2 provided outside of the bendable area BA.

The slits 1230 of the back plate 230 may serve to adjust the actual curvature of the display device 100 to reduce the difference between the preset curvature and the actual curvature of the display device 100.

When force is applied to the display device 100 to bend the display device 100, the slits 1230 of the back plate 230 allow the display device 100 to be bent at a curvature corresponding to the force applied to the display device 100.

Although the configuration in which the display device 100 includes a single bendable area BA has mainly been described hereinabove, the present disclosure is not limited thereto.

FIG. 19 is a cross-sectional view illustrating a display device including a plurality of bendable areas. In the following description, descriptions of some features (e.g., components, effects, or the like), which are the same as those of the foregoing embodiments, may be omitted.

Referring to FIG. 19, the display device 100 includes a plurality of bendable areas BA1 and BA2. For example, as illustrated in FIG. 19, the display device 100 may include a first bendable area BA1 and a second bendable area BA2.

In addition, the display device 100 may include a plurality of non-bendable areas NBA1, NBA2, and NBA3. For example, the display device 100 may include a first non-bendable area NBA1, a second non-bendable area NBA2, and a third non-bendable area NBA3.

The first non-bendable area NBA1 and the second non-bendable area NBA2 may be disposed on both sides of the first bendable area BA1, while the second non-bendable area NBA2 and the third non-bendable area NBA3 may be disposed on both sides of the second bendable area BA2.

The deformation prevention structure 230 may be provided with two or more slits 1230 or two or more grooves in each of the first bendable area BA1 and the second bendable area NA2.

In addition, the slits 1230, provided in the first and second bendable areas BA1 and BA2, may serve to adjust the actual curvature of the display device 100 to reduce the difference between the preset curvature and the actual curvature of the display device 100 in the bendable areas BA1 and BA2, respectively.

In the display device 100 according to the present exemplary embodiments, the deformation prevention structure 230 may be referred to as an impact resistance-improving structure, since the deformation prevention structure 230 serves to improve the impact resistance of the display device 100, i.e., the high impact resistance of the deformation prevention structure 230 can improve the impact resistance of the display device 100 including the deformation prevention structure 230. Accordingly, the impact resistance-improving structure may include two or more slits or two or more grooves in the bendable area BA.

The impact resistance-improving structure is bendable in at least one bendable area BA, and can have maximum impact resistance higher than either maximum impact resistance of the display panel 110 or maximum impact resistance of the back plate 220.

According to exemplary embodiments, the bendable display device has a structure able to improve the flatness of the display panel of the bendable display device.

According to exemplary embodiments, the bendable display device has a structure in which the display device may not be deformed even after being repeatedly bent.

According to exemplary embodiments, the bendable display device has a structure able to improve the impact resistance of the bendable display device.

According to exemplary embodiments, the bendable display device has a structure in which the display device may be bent at a degree of curvature corresponding to an amount of force applied to the display device to bend the display device.

The foregoing descriptions and the accompanying drawings have been presented in order to explain the certain principles of the present disclosure. A person skilled in the art to which the present disclosure relates could make various modifications and variations by combining, dividing, substituting for, or changing the elements without departing from the principle of the present disclosure. The foregoing embodiments disclosed herein shall be interpreted as illustrative, while not being limitative of the principle and scope of the present disclosure.

It should be understood that the scope of the present disclosure shall be defined by the appended claims and all of their equivalents fall within the scope of the present disclosure.

The invention claimed is:

1. A display device comprising:
 a display panel;
 a display surface disposed above the display panel and on which images are displayed;
 a back plate below the display panel;
 a deformation prevention structure below the back plate; and at least one bendable area in which the display panel, the back plate, and the deformation prevention structure are bendable, wherein the deformation prevention structure has a higher modulus than either the display panel or the back plate in the at least one bendable area, and a thickness of the deformation prevention structure is from 30 μm to 70 μm.

2. The display device according to claim 1, wherein the deformation prevention structure comprises a first deformation prevention structure and a second deformation prevention structure, and wherein a thickness of the first deformation prevention structure is smaller than a thickness of the second deformation prevention structure when the first deformation prevention structure is located more adjacently to the display panel than the second deformation prevention structure.

3. The display device according to claim 1, wherein the deformation prevention structure comprises:

a first deformation prevention structure below the display panel; and a second deformation prevention structure below the first deformation prevention structure, and wherein the first and second deformation prevention structures have different modulus.

4. The display device according to claim 1, wherein the deformation prevention structure has two or more slits or two or more grooves in the at least one bendable area, the two or more slits or the two or more grooves being provided as lines disposed parallel to a boundary line between the at least one bendable area and a non-bendable area extending from the at least one bendable area.

5. The display device according to claim 4, wherein a distance between outermost slits, from among the two or more slits, or a distance between outermost grooves, from among the two or more grooves, is shorter than a width of the at least one bendable area.

6. The display device according to claim 4, wherein the two or more slits or the two or more grooves are located to overlap the boundary line.

7. The display device according to claim 4, wherein a length of the two or more grooves, parallel to the boundary line between the at least one bendable area and the non-bendable area, is longer than a half of a length of the deformation prevention structure.

8. The display device according to claim 4, the display device comprising an active area and a non-active area located in outer circumferential portions of the active area, wherein the two or more slits or the two or more grooves are provided in the active area to extend to the non-active area.

9. The display device according to claim 8, wherein the display panel comprises a pad portion located in the non-active area, and a portion of the deformation prevention structure overlaps the pad portion.

10. The display device according to claim 1, wherein the back plate comprises two or more slits or two or more grooves in the at least one bendable area.

11. The display device according to claim 1, further comprising a backing member disposed below the deformation prevention structure, wherein the backing member is bendable in the at least one bendable area, and the back plate has one or more grooves located in the at least one bendable area.

12. A display device comprising:

a display panel;

a back plate disposed below the display panel;

an impact resistance-improving structure disposed below the back plate; and at least one bendable area in which the display panel, the back plate, and the impact resistance-improving structure are bendable, wherein the impact resistance-improving structure has a maximum impact resistance that is higher than either a maximum impact resistance of the display panel or a maximum impact resistance of the back plate.

13. The display device according to claim 12, wherein the impact resistance-improving structure has a slit or a groove located in the at least one bendable area.

14. A display device comprising:

a display panel;

a back plate below the display panel;

a deformation prevention structure below the back plate; and at least one bendable area in which the display panel, the back plate, and the deformation prevention structure are bendable, wherein the deformation prevention structure has a higher modulus than either the display panel or the back plate in the at least one bendable area, wherein the deformation prevention structure comprises a first deformation prevention structure and a second deformation prevention structure, and wherein a thickness of the first deformation prevention structure is smaller than a thickness of the second deformation prevention structure when the first deformation prevention structure is located more adjacently to the display panel than the second deformation prevention structure.

15. The display device according to claim 1, wherein the deformation prevention structure has a higher modulus than both of the display panel and the back plate in the at least one bendable area.

16. The display device according to claim 1, wherein the deformation prevention structure comprises a first deformation prevention structure and a second deformation prevention structure.

17. The display device according to claim 4, wherein the two or more slits or the two or more grooves are located closer to the boundary line than a center of the at least one bendable area.

18. The display device according to claim 1, wherein when the display device is bent, and the deformation prevention structure is disposed at an innermost side of the display device, and portions of one surface of the deformation-resistant structure face each other.

* * * * *